(12) United States Patent
Miyakawa

(10) Patent No.: US 9,171,817 B2
(45) Date of Patent: Oct. 27, 2015

(54) SEMICONDUCTOR DEVICE

(71) Applicant: KABUSHIKI KAISHA TOSHIBA, Tokyo (JP)

(72) Inventor: Takeshi Miyakawa, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,726

(22) Filed: Aug. 30, 2013

(65) Prior Publication Data

US 2014/0374926 A1 Dec. 25, 2014

(30) Foreign Application Priority Data

Jun. 20, 2013 (JP) ................. 2013-130030

(51) Int. Cl.
*H01L 23/495* (2006.01)
*H01L 23/00* (2006.01)

(52) U.S. Cl.
CPC .......... *H01L 24/29* (2013.01); *H01L 23/49524* (2013.01); *H01L 23/49562* (2013.01); *H01L 24/40* (2013.01); *H01L 23/49513* (2013.01); *H01L 24/32* (2013.01); *H01L 24/33* (2013.01); *H01L 24/37* (2013.01); *H01L 24/73* (2013.01); *H01L 2224/04026* (2013.01); *H01L 2224/04034* (2013.01); *H01L 2224/06181* (2013.01); *H01L 2224/29007* (2013.01); *H01L 2224/29083* (2013.01); *H01L 2224/29111* (2013.01); *H01L 2224/29116* (2013.01); *H01L 2224/29139* (2013.01); *H01L 2224/29144* (2013.01); *H01L 2224/29147* (2013.01); *H01L 2224/32245* (2013.01); *H01L 2224/3303* (2013.01); *H01L 2224/33181* (2013.01); *H01L 2224/37144* (2013.01); *H01L 2224/37147* (2013.01); *H01L 2224/40247* (2013.01); *H01L 2224/40491* (2013.01); *H01L 2224/73263* (2013.01); *H01L 2924/1305* (2013.01); *H01L 2924/13055* (2013.01); *H01L 2924/13091* (2013.01)

(58) Field of Classification Search
CPC ............ H01L 23/49575; H01L 23/495; H01L 23/498; H01L 23/49503; H01L 23/49541; H01L 23/49524; H01L 23/4951; H01L 23/49582; H01L 24/26; H01L 24/31; H01L 24/33; H01L 24/34; H01L 24/39
USPC ......... 257/666, 676, 678, 688, 689, 734, 773, 257/782, 786, E23.066
See application file for complete search history.

(56) References Cited

U.S. PATENT DOCUMENTS

| 8,836,145 B2* | 9/2014 | Fuchs et al. .................... 257/778 |
| 2003/0214032 A1* | 11/2003 | Fukuizumi et al. ........... 257/734 |
| 2004/0217488 A1* | 11/2004 | Luechinger ................... 257/784 |

(Continued)

FOREIGN PATENT DOCUMENTS

JP 2011-082535 A 4/2011

*Primary Examiner* — Eduardo A Rodela
(74) *Attorney, Agent, or Firm* — Patterson & Sheridan, LLP

(57) ABSTRACT

A semiconductor device includes a semiconductor chip having an electrode, a connector having a chip contact surface, an interconnecting portion, and an external electrode terminal contact surface, the chip contact surface being electrically connected to the electrode, and a first connection material disposed between the chip contact surface and the electrode, the first connecting material having a surface area that is greater than a surface area of the chip contact surface.

6 Claims, 6 Drawing Sheets

(56) References Cited

U.S. PATENT DOCUMENTS

| | | | |
|---|---|---|---|
| 2009/0218676 A1* | 9/2009 | Muto et al. | 257/693 |
| 2010/0000772 A1* | 1/2010 | Letterman et al. | 174/260 |
| 2010/0214754 A1* | 8/2010 | Luechinger | 361/783 |
| 2011/0073921 A1* | 3/2011 | Tamimoto et al. | 257/288 |
| 2011/0108968 A1* | 5/2011 | Hu et al. | 257/676 |
| 2012/0074553 A1* | 3/2012 | Hosseini et al. | 257/677 |
| 2012/0313232 A1* | 12/2012 | Zhang et al. | 257/676 |
| 2014/0001480 A1* | 1/2014 | Otremba et al. | 257/76 |
| 2015/0041984 A1* | 2/2015 | Otremba et al. | 257/773 |

* cited by examiner

SEMICONDUCTOR DEVICE

CROSS-REFERENCE TO RELATED APPLICATION

This application is based upon and claims the benefit of priority from Japanese Patent Application No. 2013-130030, filed Jun. 20, 2013, the entire contents of which are incorporated herein by reference.

FIELD

Embodiments described herein relate generally to a semiconductor device.

BACKGROUND

Conventionally, semiconductor devices include semiconductor chips including metal oxide semiconductor field effect transistors (MOSFETs) having vertically oriented electrode structures with copper connectors, or the like, that are connected to lead frames or external electrode terminals. In these devices, copper connectors having the same size and shape (i.e. standard connectors) are used in order to improve the efficiencies of managing the inventory to manufacture different products. However, the sizes of semiconductor chips may be different and thus the contact area of the standard connector may not be suitable for connection with differently sized semiconductor chips. In some instances the contact area of the semiconductor chip may be smaller than the contact area of the standard connector. This may result in increased resistance between an external electrode and the semiconductor chip, which may cause degradation of the semiconductor chip performance.

DETAILED DESCRIPTION

Figure 1:
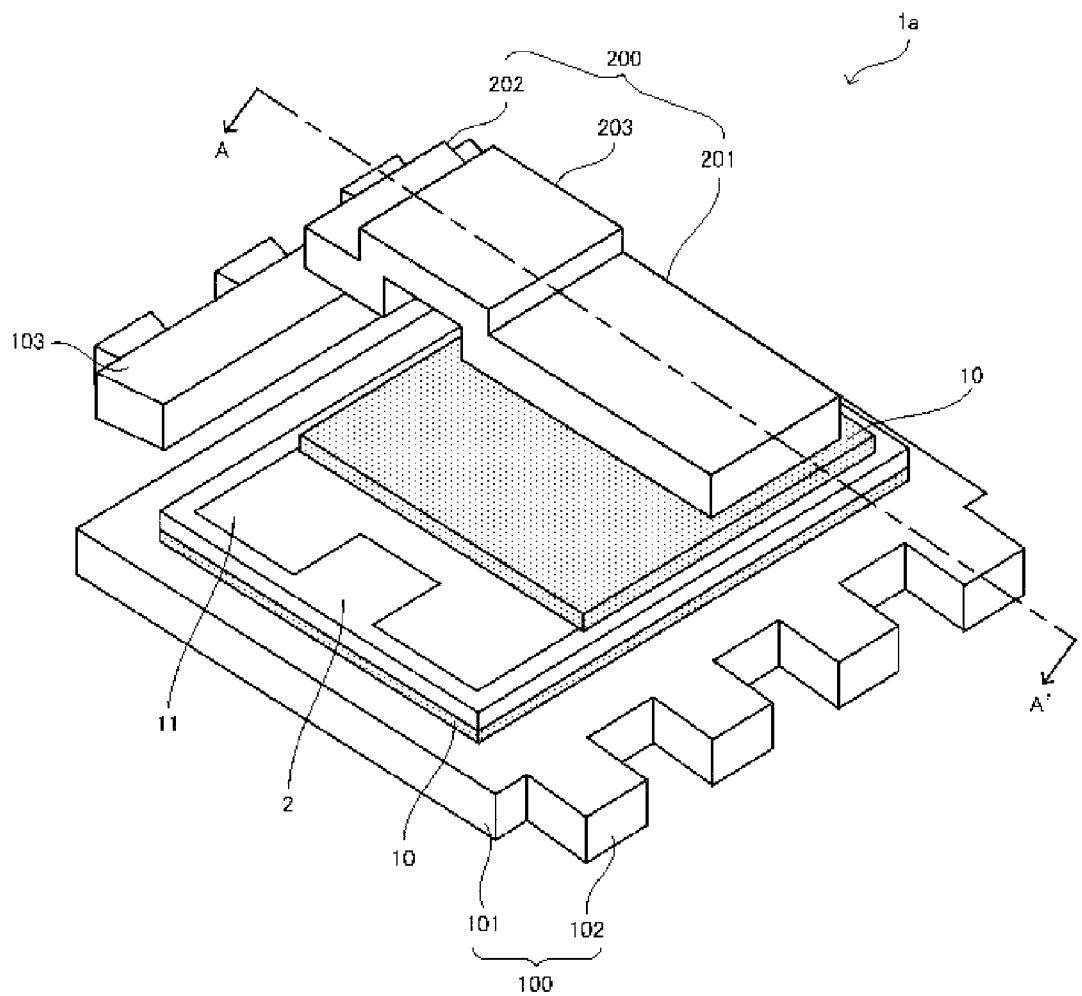
FIG. 1 is a perspective view of a semiconductor device according to a first embodiment.

One embodiment of the present disclosure provides a semiconductor device having reduced contact resistance between an external electrode and a semiconductor chip.

In general, according to one embodiment, a semiconductor device includes a semiconductor chip that has an electrode, a connector that has a chip contact surface, an interconnecting portion, and an external electrode terminal contact surface, the chip contact being electrically connected to the electrode, and a first connection material that is wider than the area of the chip contact surface and is provided between the chip contact surface and the electrode.

Hereinafter, embodiments of the present disclosure will be described with reference to the drawings. The drawings to be used for explaining the embodiments are schematic drawings for facilitating the explanation. The shapes, dimensions, and scale of the components are not necessarily limited to those shown in the drawings, and can be appropriately changed within a range in which the effects of the present disclosure can be obtained.

The structure of a semiconductor device 1a according to a first embodiment of the present disclosure will be described with reference to FIGS. 1 and 2.

Figure 2:
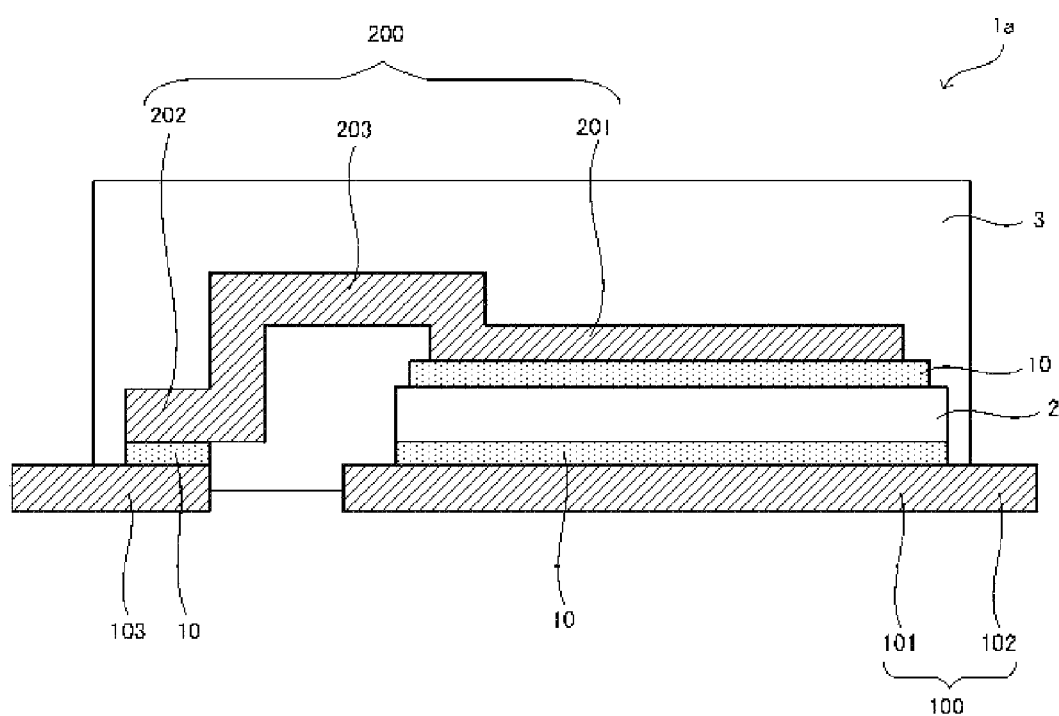
FIG. 2 is a cross-sectional view illustrating a cross section along the line A-A' of FIG. 1.

FIG. 1 shows a perspective view of the semiconductor device 1a according to the first embodiment of the present disclosure, and FIG. 2 shows a cross-sectional view illustrating a cross section along the line A-A' of FIG. 1. Also, in the perspective view of FIG. 1, a resin 3 shown in FIG. 2 is omitted in FIG. 1 for clarity.

The semiconductor device 1a includes a semiconductor chip 2, the resin 3, a lead frame 100 (external electrode terminal), a source terminal 103, and a connector 200. The semiconductor chip 2 is, for example, a MOSFET having a vertically oriented electrode structure. In the present embodiment, the semiconductor chip 2 is described as the MOSFET; however, the semiconductor chip 2 may be an insulated gate bipolar transistor (IGBT). When the semiconductor chip 2 is a MOSFET, an upper electrode and a lower electrode constitute a source electrode and a drain electrode, respectively.

The lead frame 100 includes a header 101 and a plurality of drain terminals 102. As shown in FIG. 2, the plurality of drain terminals 102 extend from the header 101, and provide an electrical connection between the semiconductor chip 2 and an external power supply. Between the header 101 and the semiconductor chip 2 is provided solder 10 (a first connection material) interposed therebetween such that the drain electrode (not shown) of the semiconductor chip 2 is electrically connected to the header 101. The semiconductor chip 2 is fixed to the lead frame 100 by the solder 10 such that a source electrode 11 is exposed.

Further, the source electrode 11 is electrically connected to the connector 200 through the solder 10. The connector 200 is configured, for example, in a shape in which a chip contact surface 201, a lead frame contact surface 202 (external electrode terminal contact surface), and an interconnecting portion 203 are provided as shown in FIGS. 1 and 2. The interconnecting portion 203 is located between the chip contact surface 201 and the lead frame contact surface 202, and electrically connects the chip contact surface 201 and the lead frame contact surface 202. The source electrode 11 is connected to the chip contact surface 201.

The solder 10 is provided on the source electrode 11 such that when the chip contact surface 201 of the connector 200 is connected to the source electrode 11, the applied surface area of the solder 10 between the lead frame 100 and the chip 2 is greater (wider) than the surface area of the chip contact surface 201 with the chip 2. That is, the solder 10 is provided over substantially the entire surface of the source electrode 11, but the chip contact surface 201 of the connector 200 may only overlay and connect to a portion of that solder layer 10.

The lead frame contact surface 202 of the connector 200 is connected to the source terminal 103 via solder 10. The lead frame contact surface 202 provides electrical connection between the semiconductor chip 2 and the external power supply.

Then, except for portions of the drain terminals 102 and the source terminal 103 needed for electrical connection, the semiconductor chip 2, the lead frame 100, the connector 200, and the source terminal 103 are enclosed with the resin 3 such as an epoxy resin. At this point, the packaging is completed, for example, such that the lower surfaces of the lead frame 100 and the source terminal 103 are exposed as shown in FIG. 2. The semiconductor device 1a has a structure as described above.

For the lead frame 100 and the connector 200, for example, copper (Cu) or the like can be used, and alloys with gold (Au) or other metals can be used. The solder 10 may include lead (Pb) and tin (Sn) as main components. The solder 10 may also be lead-free solder. In case of a lead-free solder, an alloy of silver (Ag) and tin, an alloy of silver and copper, an alloy of silver and gold, or the like, can be used.

The effects of the first embodiment will be described. As electrical resistance occurring during use of the semiconductor device 1a, package resistance can be exemplified. The package resistance is composed of a resistance component of a connection material (hereinafter, referred to as the connector 200) which is connected to the semiconductor chip 2, and a resistance component which occurs when an electric current flows from the semiconductor chip 2 to the connector 200.

The resistance component of the connector 200 is determined by the material and shape of the connector 200. Meanwhile, the resistance component which occurs when an electric current flows from the semiconductor chip 2 to the connector 200 depends on the path of the electric current. Specifically, an electric current path from a portion of the semiconductor chip 2 located just below the connector 200 becomes the shortest distance; however, from the other portion of the semiconductor chip 2 which is not located just below the connector 200, the electric current flows to the connector 200 through a surface layer of the source electrode 11. Also, the source electrode 11 is thin aluminum (Al) of about 5 μm provided on the surface of the semiconductor chip 2. Therefore, the electric current path to the connector 200 through the thin surface layer of the source electrode 11 has a resistance component greater than the resistance component of the electric current flowing from the portion of the semiconductor chip 2 located just below the connector 200.

Here, if the area of the chip contact surface 201 of the connector 200 is increased so that the chip contact surface 201 comes into contact with substantially the entire surface of the source electrode 11, the above described resistance component can be reduced. However, when the connector 200 is used with semiconductor chips 2 of various sizes, the connector 200 may not be used when the surface area of the source electrode 11 is smaller than the surface area of the chip contact surface 201, and thus problems, such as reducing production efficiency of the manufacturing of semiconductor device 1a may occur.

In the case of the semiconductor device 1a according to the first embodiment, since the solder 10 is provided over substantially the entire surface of the source electrode 11, the solder 10 becomes a path for the electric current passing between the chip 2 and the connector 200. Hence, by extending the solder layer over a greater area of the source electrode than the area of the second electrode overlaid by the contact surface 201 of the connector 200, the resistance component of the electric current between the connector 200 and that portion of the semiconductor chip 2 which is not located just below the connector 200 is reduced. Thus, it is possible to reduce the package resistance of the semiconductor device 1a despite having the contact portion of a connector configured to be smaller than the electrode to which it is connected.

Also, since the amount of the solder 10 to be applied onto the source electrode 11 is modified according to the area of the source electrode 11, it is unnecessary to alter the connector 200 to change the area of the chip contact surface 201. Therefore, it becomes possible to use a common connector 200 for semiconductor chips 2 having various chip sizes. As a result, it becomes possible to maintain the production efficiency of the manufacture of semiconductor device 1a.

Further, since the solder 10 is provided at locations other than a position where the chip contact surface 201 is in contact with the source electrode 11, it becomes possible to distribute heat generated from the semiconductor chip 2 during use of the semiconductor device through the additional solder not directly between an electrode and a connector. Since the heat is distributed over the substantially entire surface of the source electrode 11, it becomes possible to efficiently dissipate the heat generated during use of the semiconductor device 1a. That is, thermal resistance of the semiconductor device 1a is improved, and it is possible to suppress thermal degradation of the semiconductor device 1a which may occur when a high electric current flows therethrough.

The structure of a semiconductor device 1b according to a second embodiment will be described with reference to FIGS. 3 and 4.

Figure 3:
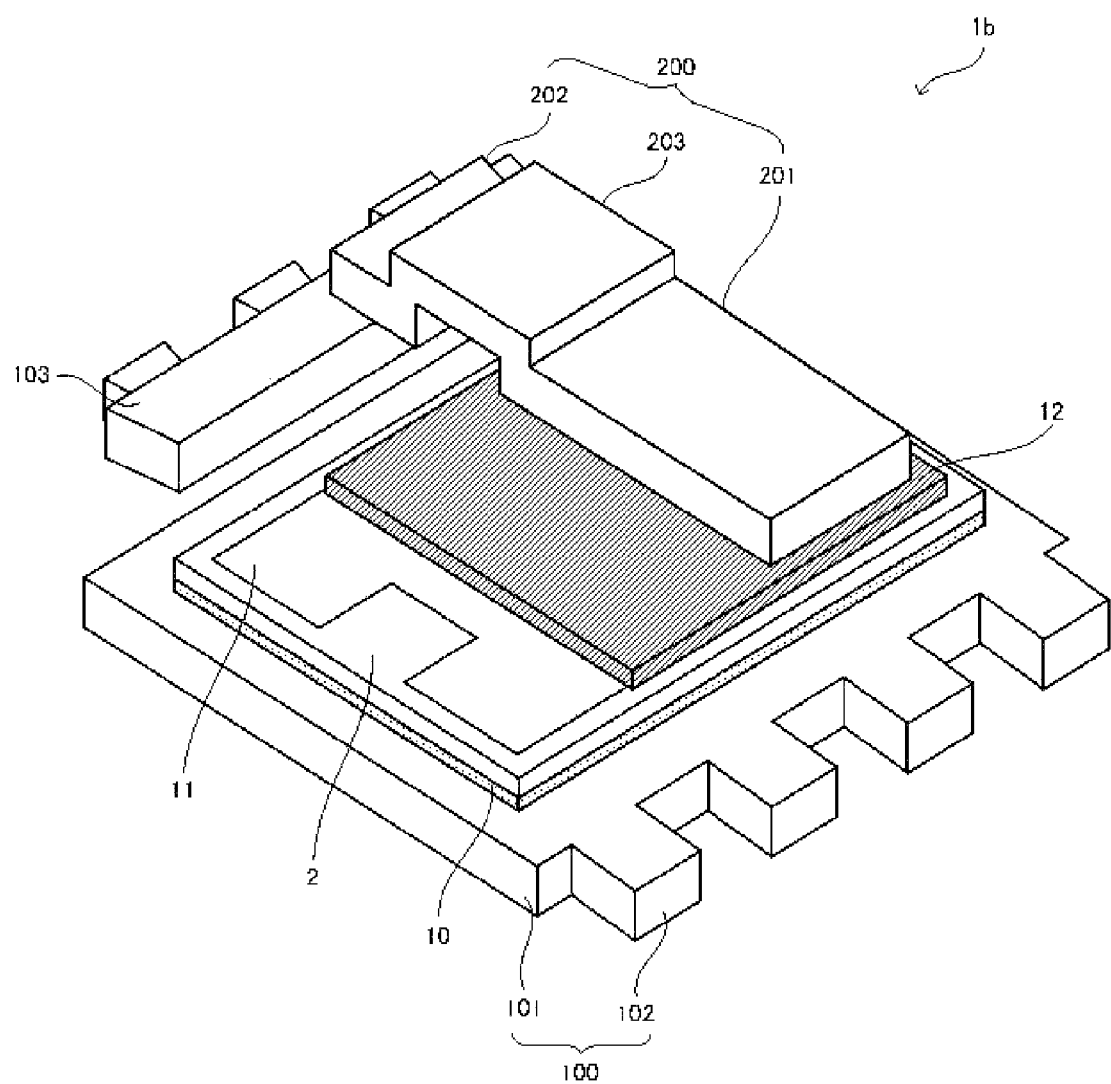
FIG. 3 is a perspective view of a semiconductor device according to a second embodiment.
Figure 4:
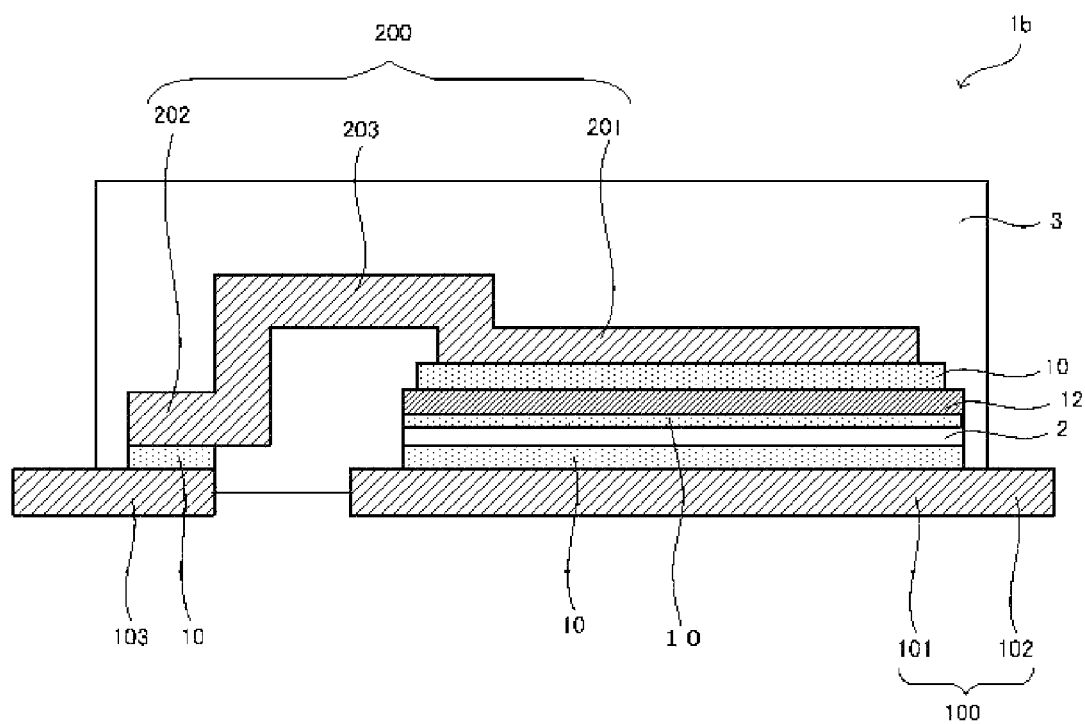
FIG. 4 is a cross-sectional view illustrating a cross section along the line B-B' of FIG. 3.

FIG. 3 shows a perspective view of the semiconductor device 1b according to the second embodiment, and FIG. 4 shows a cross-sectional view illustrating a cross section along the line B-B' of FIG. 3.

As shown in FIGS. 3 and 4, the semiconductor device 1b according to the second embodiment is the same as the semiconductor device 1a according to the first embodiment with the following exception. A first metal plate 12 is provided between the semiconductor chip 2 and the chip contact surface 201. The other elements are the same as the semiconductor device 1a, and thus will not be described for brevity.

The first metal plate 12 is placed on the header 101 with a solder 10 (third connection material) interposed therebetween. A solder 10 (first connection material) is also interposed between the connector 200 and the first metal plate 12 such that the chip contact surface 201 of the connector 200 is connected to the first metal plate 12 through the solder 10. The surface area of the first metal plate 12 is greater than the surface area of the chip contact surface 201 of the connector, and does not need to be the same as the surface area of a solder 10 between the first metal plate 12 and the semiconductor chip 2 (second connection material) provided over substantially the entire surface of the source electrode 11.

Similar to the semiconductor device 1a, the semiconductor device 1b reduces the package resistance, maintains the production efficiency, and suppresses the thermal degradation. Further, the effective thickness of the source electrode 11 may be increased by using the first metal plate 12 making it possible to further reduce the resistance component in the path of the electric current which flows from the semiconductor chip 2 to the connector 200.

Also, since the surface area of the first metal plate 12 is provided to be greater than the surface area of the solder 10 or the surface area of the semiconductor chip 2, the heat distribution is improved during use of the semiconductor device 1b. Thus, it is possible to improve the thermal resistance of the semiconductor device 1b, and it is possible to further suppress the thermal degradation of the semiconductor device 1b when a high electric current flows therethrough.

Further, the increased surface area of the first metal plate 12 increases the heat capacity of the semiconductor device 1b making it possible to increase the time for thermal saturation of the semiconductor device 1b during use.

Figure 5:
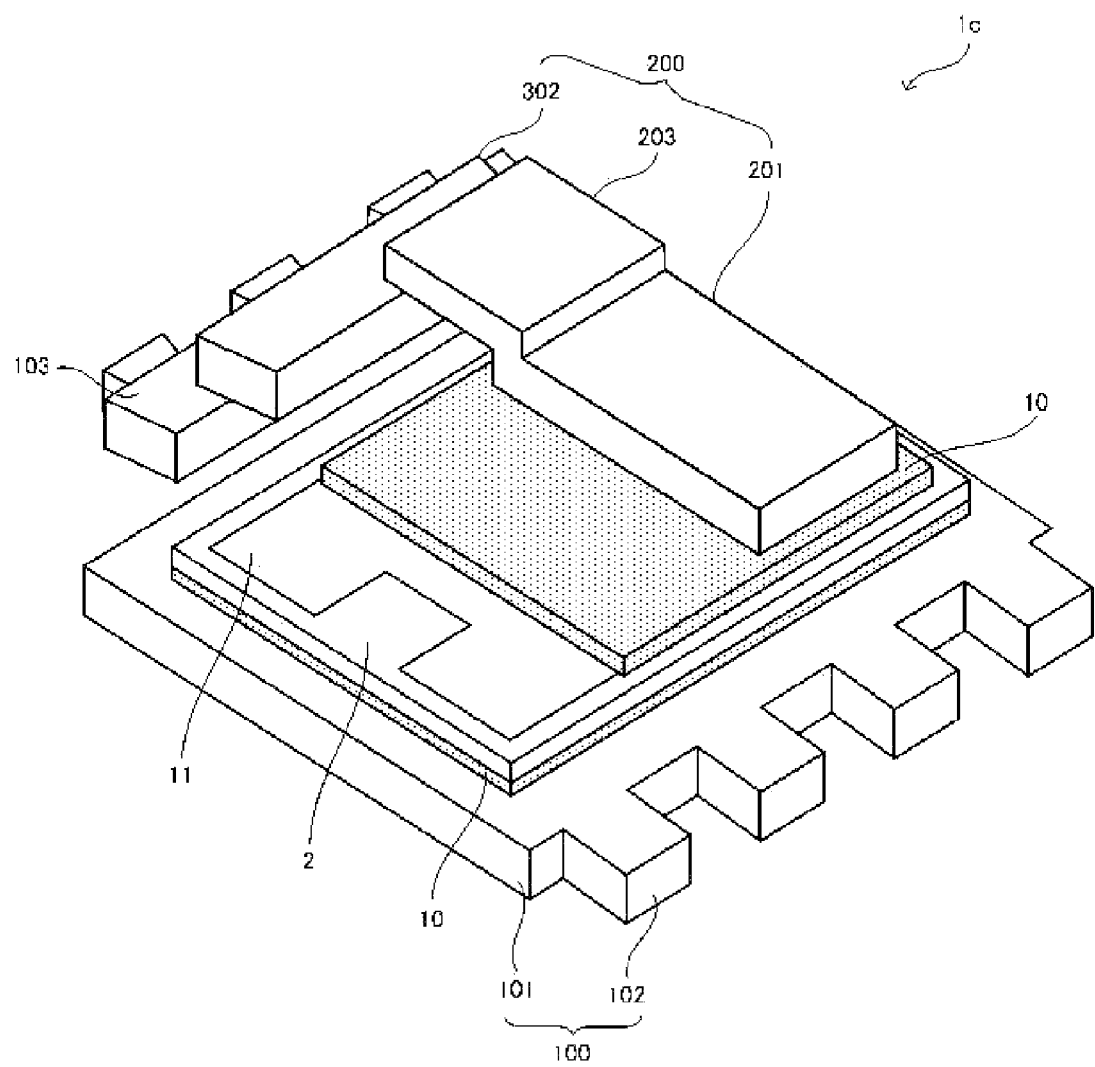
FIG. 5 is a perspective view of a semiconductor device according to a third embodiment.

Subsequently, the structure of a semiconductor device 1c according to a third embodiment will be described with reference to FIG. 5. FIG. 5 shows a perspective view of the semiconductor device 1c according to the third embodiment.

As shown in FIG. 5, the semiconductor device 1c according to the third embodiment is the same as the semiconductor device 1a according to the first embodiment in with the following exception. A lead frame contact plate 302 is provided (in place of or as a substitute for lead frame contact 202) between the interconnecting portion 203 of the connector 200 and the source terminal, and is sized such that the contact area between the plate 302 and the source terminal 103 is greater than the contact area between the source terminal 103 with the lead frame contact surface 202 of the semiconductor device 1a. The lead frame contact plate 302 may be provided separately from and attached to the interconnecting portion 203 of the connector 200, such as by screws, solder, or other attachments enabling electric conduction therethrough, or it may an integral part of the connector 200. The other elements are the same as the semiconductor device 1a, and thus will not be described for brevity.

The connector 200 has a shape in which the chip contact surface 201, the interconnecting portion 203, and the lead frame contact plate 302 are connected. In the semiconductor device 1a, the width of the connector 200 in a direction perpendicular to the connection direction of the chip contact surface, the interconnecting portion, and the lead frame contact surface, is constant. Meanwhile, in the semiconductor device 1c, the area of contact between the lead frame contact plate 302 and the source terminal 103 is greater than the area of the chip contact surface 201 and the interconnecting portion 203 in order to increase the contact area with the source terminal 103. As a result, the semiconductor device 1c makes it possible to increase the contact area of the lead frame contact plate 302 and the source terminal 103 as compared to the semiconductor device 1a.

Similar to the semiconductor device 1a, the semiconductor device 1c makes it possible to reduce the package resistance, maintain the production efficiency, and suppress thermal degradation of the packaged device. Further, it is possible to substantially enlarge the path of the electric current which flows from the connector 200 to the source terminal 103 by increasing the contact area of the lead frame contact plate 302 and the source terminal 103. For this reason, it is possible to reduce the resistance component of the electric current which flows from the connector 200 to the source terminal 103. Thus, it is possible to reduce the package resistance of the semiconductor device 1c.

Figure 6:
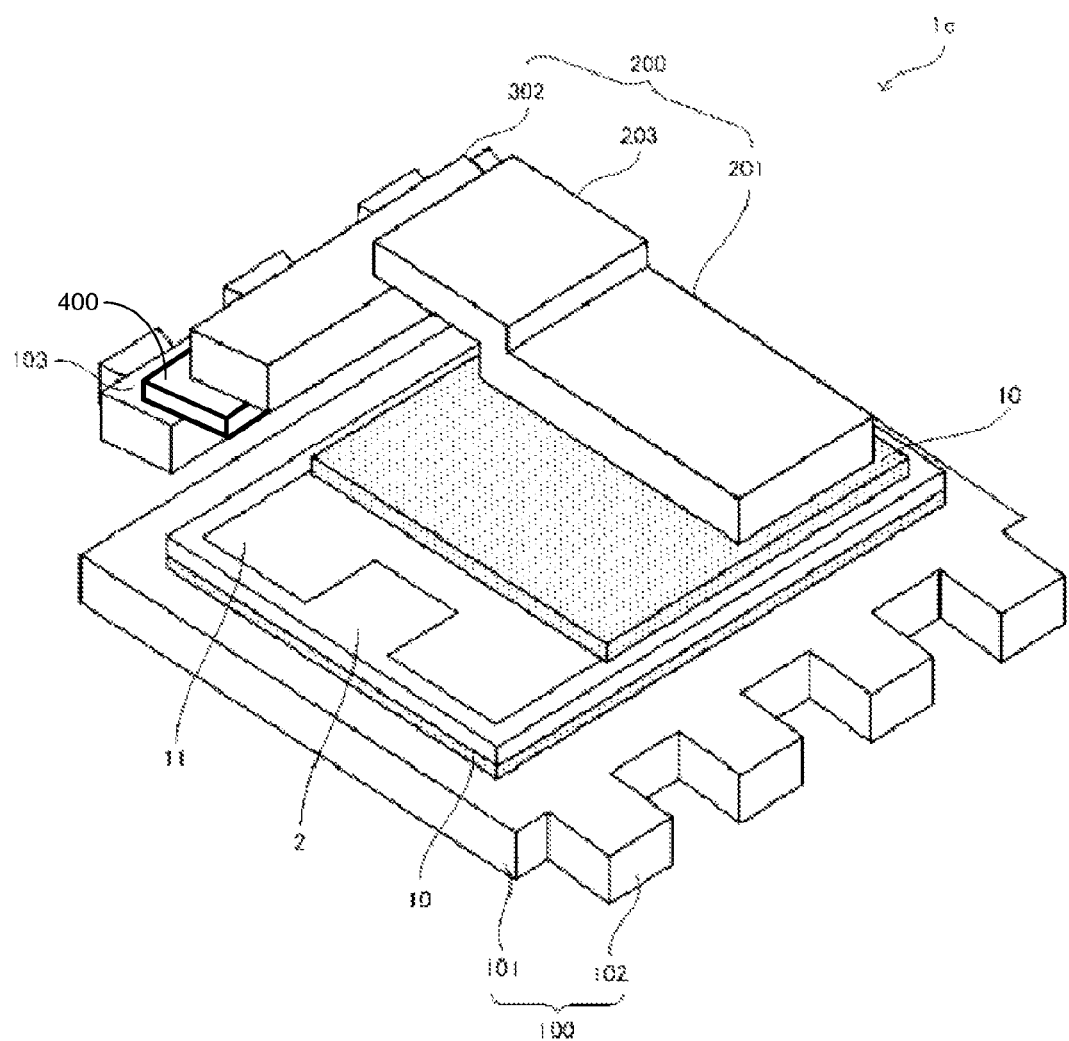
FIG. 6 is a perspective view of a semiconductor device according to a modification of the third embodiment.

Also, in the third embodiment, an example in which the width of the lead frame contact plate 302 is greater than the widths of the chip contact surface 201 and the interconnecting portion 203 has been exemplified. However, the amount of the solder 10 applied to the source electrode 11 may be greater than the surface area of the lead frame contact plate 302 in contact with the source terminal 103. Alternatively, a second metal plate 400 may be provided between the lead frame contact plate 302 and the source electrode 11 as shown in FIG. 6. The second metal plate 400 may have a contact area between itself and the lead frame contact plate 302 and/or between itself and the source terminal 103 which is larger than the contact area of the lead frame contact plate 302 and the source electrode 11. The second metal plate 400 may be electrically connected to adjacent components via a solder (not shown).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, the embodiments described above may be combined and embodied.

What is claimed is:

1. A semiconductor device, comprising:
   a semiconductor chip including an electrode;
   a connector having a chip contact surface, an interconnecting portion, and an external electrode terminal contact surface, the chip contact surface being electrically connected to the electrode;
   a first connection material disposed between the chip contact surface and the electrode, the first connection material having a surface area that is greater than a surface area of the chip contact surface;
   a first metal plate provided between the chip contact surface and the electrode; and
   a second connection material disposed between the first metal plate and the electrode.

2. The semiconductor device according to claim 1, wherein the first metal plate includes a surface area that is greater than the surface area of the chip contact surface.

3. The semiconductor device according to claim 1, wherein a width of the external electrode terminal contact surface is greater than the width of the interconnecting portion in a direction perpendicular to the connection direction of the interconnecting portion and the external electrode terminal contact surface.

4. The semiconductor device according to claim 1, further comprising:
   an external electrode terminal which is electrically connected with the external electrode terminal contact surface through a second metal plate having a surface area that is greater than a surface area of the external electrode terminal contact surface.

5. A semiconductor device, comprising:
   a semiconductor chip including an electrode;
   a connector having a chip contact surface, an interconnecting portion, and an external electrode terminal contact surface, the chip contact surface being electrically connected to the electrode;
   a first connection material disposed between the chip contact surface and the electrode, the first connection material having a surface area that is greater than a surface area of the chip contact surface; and
   an external electrode terminal which is electrically connected with the external electrode terminal contact surface through a second metal plate having a surface area that is greater than a surface area of the external electrode terminal contact surface.

6. A semiconductor device, comprising:
   a semiconductor chip including an electrode;
   a connector having a chip contact surface, an interconnecting portion, and an external electrode terminal contact surface, the chip contact surface being electrically connected to the electrode;
   a solder material disposed between the entire chip contact surface and the electrode, the solder material having a surface area that is greater than a surface area of the chip contact surface; and
   an external electrode terminal which is electrically connected with the external electrode terminal contact surface through a second metal plate having a surface area that is greater than a surface area of the external electrode terminal contact surface.

* * * * *